US008716098B1

(12) United States Patent
Herner et al.

(10) Patent No.: US 8,716,098 B1
(45) Date of Patent: May 6, 2014

(54) SELECTIVE REMOVAL METHOD AND STRUCTURE OF SILVER IN RESISTIVE SWITCHING DEVICE FOR A NON-VOLATILE MEMORY DEVICE

(75) Inventors: Scott Brad Herner, San Jose, CA (US); Natividad Vasquez, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/417,135

(22) Filed: Mar. 9, 2012

(51) Int. Cl.
*H01L 21/20* (2006.01)

(52) U.S. Cl.
USPC ........... 438/381; 438/482; 438/658; 438/661; 438/669; 438/670; 257/4; 257/324; 257/E21.003; 257/E45.002

(58) Field of Classification Search
None
See application file for complete search history.

(56) References Cited

U.S. PATENT DOCUMENTS

| | | | |
|---|---|---|---|
| 680,652 | A | 8/1901 | Elden |
| 4,433,468 | A | 2/1984 | Kawamata |
| 4,684,972 | A | 8/1987 | Owen et al. |
| 4,741,601 | A | 5/1988 | Saito |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,538,564 | A | 7/1996 | Kaschmitter |
| 5,541,869 | A | 7/1996 | Rose et al. |
| 5,594,363 | A | 1/1997 | Freeman et al. |
| 5,614,756 | A | 3/1997 | Forouhi et al. |
| 5,714,416 | A | 2/1998 | Eichman et al. |
| 5,751,012 | A | 5/1998 | Wolstenholme et al. |
| 5,840,608 | A | 11/1998 | Chang |
| 5,970,332 | A | 10/1999 | Pruijmboom et al. |
| 5,998,244 | A | 12/1999 | Wolstenholme et al. |
| 6,128,214 | A | 10/2000 | Kuekes et al. |
| 6,143,642 | A | 11/2000 | Sur, Jr. et al. |

(Continued)

FOREIGN PATENT DOCUMENTS

| | | |
|---|---|---|
| EP | 2405441 A1 | 1/2012 |
| EP | 2408035 A2 | 1/2012 |
| WO | WO 2009/005699 A1 | 1/2009 |

OTHER PUBLICATIONS

Office Action for U.S. Appl. No. 13/725,331, dated May 20, 2013.

(Continued)

*Primary Examiner* — Zandra Smith
*Assistant Examiner* — Khanh Duong
(74) *Attorney, Agent, or Firm* — Ogawa P.C.

(57) ABSTRACT

A method for forming a non-volatile memory device includes providing a substrate having a surface region, forming a first wiring structure overlying the surface region, depositing a first dielectric material overlying the first wiring structure, forming a via opening in the first dielectric material to expose a portion of the first wiring structure, while maintaining a portion of the first dielectric material, forming a layer of resistive switching material comprising silicon, within the via opening, forming a silver material overlying the layer of resistive switching material and the portion of the first dielectric material, forming a diffusion barrier layer overlying the silver material, and selectively removing a portion of the silver material and a portion of the diffusion barrier layer overlying the portion of the first dielectric material while maintaining a portion of the silver material and a portion of the diffusion barrier material overlying the layer of silicon material.

21 Claims, 7 Drawing Sheets

(56) References Cited

U.S. PATENT DOCUMENTS

| | | |
|---|---|---|
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 * | 5/2009 | Karpov et al. .................... 438/3 |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 * | 1/2012 | Herner ........................ 438/658 |
| 8,097,874 B2 | 1/2012 | Venkatasamy et al. |
| 8,102,698 B2 | 1/2012 | Scheuerlein |
| 8,143,092 B2 * | 3/2012 | Kumar et al. ................ 438/104 |
| 8,144,498 B2 | 3/2012 | Kumar et al. |
| 8,164,948 B2 | 4/2012 | Katti et al. |
| 8,168,506 B2 * | 5/2012 | Herner ........................ 438/381 |
| 8,183,553 B2 * | 5/2012 | Phatak et al. .................... 257/4 |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0062045 A1 | 3/2005 | Bhattacharyya |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0206931 A1 | 8/2008 | Breuil et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0014707 A1 * | 1/2009 | Lu et al. ........................... 257/4 |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 * | 1/2010 | Sakamoto .................... 257/324 |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0317470 A1 | 12/2011 | Lu et al. |
| 2012/0007035 A1 | 1/2012 | Jo et al. |

(56) References Cited

U.S. PATENT DOCUMENTS

| | | | |
|---|---|---|---|
| 2012/0008366 A1 | 1/2012 | Lu | |
| 2012/0012806 A1 | 1/2012 | Herner | |
| 2012/0015506 A1* | 1/2012 | Jo et al. | 438/482 |
| 2012/0025161 A1 | 2/2012 | Rathor et al. | |
| 2012/0033479 A1 | 2/2012 | Delucca et al. | |
| 2012/0043519 A1* | 2/2012 | Jo et al. | 257/4 |
| 2012/0043654 A1 | 2/2012 | Lu et al. | |
| 2012/0074507 A1 | 3/2012 | Jo et al. | |
| 2012/0080798 A1 | 4/2012 | Harshfield | |
| 2012/0104351 A1 | 5/2012 | Wei et al. | |
| 2012/0108030 A1 | 5/2012 | Herner | |
| 2012/0145984 A1 | 6/2012 | Rabkin et al. | |
| 2012/0155146 A1 | 6/2012 | Ueda et al. | |
| 2012/0205606 A1 | 8/2012 | Lee et al. | |
| 2012/0235112 A1* | 9/2012 | Huo et al. | 257/4 |
| 2012/0252183 A1 | 10/2012 | Herner | |

OTHER PUBLICATIONS

International Search Report and Written Opinion for PCT/US2012/045312 filed on Jul. 2, 2012.

Office Action for U.S. Appl. No. 13/466,008, dated Jul. 29, 2013.

Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.

Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.

Office Action for U.S. Appl. No. 13/077,941, dated Aug. 12, 2013.

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of NonCrystalline Solids 59 & 60,1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.

Office Action for U.S. Appl. No. 11/875,541 dated Mar. 30, 2011.

Office Action for U.S. Appl. No. 11/875,541 dated Oct. 5, 2011.

Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.

Office Action for U.S. Appl. No. 12/835,704 dated Mar. 1, 2012.

Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.

Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

(56) References Cited

OTHER PUBLICATIONS

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin $SiO_2$ films", Applied Physics Letters, 1989, pp. 128-130, vol. 55.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52, No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper

(56) References Cited

OTHER PUBLICATIONS

CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Office Action for U.S. Appl. No. 13/594,665 dated Aug. 2, 2013.
Notice of Allowance for U.S. Appl. No. 13/769,152, dated Oct. 8, 2013,.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Office Action for U.S. Appl. No. 13/564,639, dated Dec. 6, 2013.

\* cited by examiner

SELECTIVE REMOVAL METHOD AND STRUCTURE OF SILVER IN RESISTIVE SWITCHING DEVICE FOR A NON-VOLATILE MEMORY DEVICE

CROSS REFERENCE TO RELATED APPLICATIONS

Not Applicable

STATEMENTS RELATED TO GOVERNMENT OR FEDERALLY FUNDED RESEARCH

Not Applicable

BACKGROUND

The present invention is generally related to resistive switching devices. More particularly, embodiments according to the present invention provide a method to form an active metal material for resistive switching of a resistive switching device. The present invention can be applied to non-volatile memory devices but it should be recognized that the present invention can have a much broader range of applicability.

The success of semiconductor devices has been primarily driven by an intensive transistor down-scaling process. However, as field effect transistors (FET) approach sizes less than 100 nm, problems arise such as the short channel effect, that degrade device performance. Moreover, such sub 100 nm device sizes can lead to sub-threshold slope non-scaling and increase in power dissipation. It is generally believed that transistor-based memories such as those commonly known as Flash may end scaling within a decade.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures that couple with silicon-based devices to form a memory cell, but they lack one or more key attributes. For example, Fe-RAM and MRAM devices have fast switching characteristics and good programming endurance, but their fabrication is not CMOS compatible they are usually large in size. Switching a PCRAM device requires a large amount of power. Organic RAM or ORAM devices are incompatible with large volume silicon-based fabrication and device reliability is usually poor.

From the above, a new semiconductor device structure and integration is desirable.

BRIEF SUMMARY OF THE PRESENT INVENTION

The present invention is generally related to resistive switching devices. More particularly, embodiments according to the present invention provide a method to form an active metal material for resistive switching of a resistive switching device. The present invention can be applied to non-volatile memory devices but it should be recognized that the present invention can have a much broader range of applicability.

In a specific embodiment, a method for forming an active material for a non-volatile memory device is provided. The method includes providing a substrate having a surface region. A first dielectric material is deposited overlying the surface region and a first wiring structure is formed overlying the first dielectric material. The method includes depositing a second dielectric material overlying the first wiring structure and forming a via opening in portions of the second dielectric material to expose a portion of the first wiring structure. A resistive switching material comprising a silicon material is deposited to fill a first portion of the via opening. In a specific embodiment, a metal material is deposited to fill a second portion of the via structure and overlying an exposed surface region of the second dielectric material. The metal material is configured to be in direct contact with the resistive switching material in a specific embodiment. The method deposits a diffusion barrier layer overlying the metal material and forms a masking layer overlying a first portion of the diffusion barrier layer while exposing a second portion of the diffusion barrier layer. In a specific embodiment the first portion overlies the via opening and the second portion overlies the second dielectric material. In a specific embodiment, the method includes selectively removing the metal material and the diffusion barrier layer from at least the surface region of the second dielectric material and maintaining the diffusion barrier material and the metal material in the second portion of the via opening and maintaining the metal material to be in physical and electrical contact with the resistive switching material.

Many benefits can be achieved by ways of the present invention. Certain materials such as noble metals have no suitable volatile species thus making reactive ion etching in fabrication not a viable option. Embodiments according to the present invention provide a method to eliminate a metal etching step for forming an active noble metal for resistive switching. The active noble material can be a part of a wiring structure in certain implementation. The wiring structure is substantially free from defects resulting from etched particles from the noble materials and shorts are prevented. Additionally, the present method uses convention processing techniques without modification to the equipment. Depending on the embodiment, one or more of these benefits may be achieved. One skilled in the art would recognize other modifications, variations, and alternatives.

According to one aspect of the invention, a method for forming a non-volatile memory device configured with a resistive switching element, is disclosed. One technique includes providing a substrate having a surface region, depositing a first dielectric material overlying the surface region, and forming a first wiring structure overlying the first dielectric material. A process includes depositing a second dielectric material overlying the first wiring structure, and forming a via opening in the second dielectric material to expose a portion of the first wiring structure, while maintaining a portion of the second dielectric material. A method includes forming a resistive switching material comprising an amorphous silicon material within the via opening, and depositing a metal material comprising a silver material, wherein a first portion of the metal material overlies the resistive switching material, and wherein a second portion of the metal overlies at least the portion of the dielectric material, wherein the first portion of the metal material contacts the resistive switching material. An operation includes forming a diffusion barrier layer overlying the metal material, wherein a first portion of the diffusion barrier layer contacts the first portion of the metal material. and selectively removing the second portion of the metal material and a second portion of the diffusion barrier layer overlying the second portion of the metal material using a solution at a predetermined temperature while maintaining the portion of the diffusion barrier material and the first portion of the metal material within the via opening.

According to another aspect of the invention, a method for forming a silver active metal for a non-volatile memory device is disclosed. One technique includes forming a first wiring structure overlying a surface region of a substrate, depositing a first dielectric material overlying the first wiring structure, and forming a via opening in the first dielectric material to expose a portion of the first wiring structure, while maintaining a portion of the first dielectric material. A process includes forming a layer of resistive switching material within the via opening, wherein the resistive switching material comprises a silicon material, forming a silver material overlying the layer of resistive switching material and overlying the portion of the first dielectric material, and forming a diffusion barrier layer overlying the silver material to form a resulting structure. A method includes selectively removing a portion of the silver material and a portion of the diffusion barrier layer overlying the portion of the first dielectric material while maintaining a portion of the silver material and a portion of the diffusion barrier material overlying the layer of silicon material within the via opening.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAIL DESCRIPTION OF THE PRESENT INVENTION

The present invention is generally related to resistive switching devices. More particularly, embodiments according to the present invention provide a method to form an active metal material for resistive switching of a resistive switching device. The present invention can be applied to non-volatile memory devices but it should be recognized that the present invention can have a much broader range of applicability.

Resistive switching behavior has been observed and studied in micrometer-scale amorphous silicon (a-Si) devices since the 1980s. A typical device consists of a pair of metal electrodes sandwiching an amorphous-Si layer in a so-called Metal/a-Si/Metal (M/a-Si/M) structure, in which the voltage applied across the pair of metal electrodes causes changes in the resistance of the a-Si material. These conventional M/a-Si/M based switching devices can have the advantages of high Ion/Ioff ratios, and can be fabricated with a CMOS compatible fabrication process and materials.

To further decrease cost per bit, device shrinking, process simplification, as well as yield improvement, among others, are necessary. Particles from an etching process, especially from a metal etch, produce defects that cause electrical shorts and impacting device reliability and rendering device inoperable. Embodiments according to the present invention provide a method and a structure to form a non-volatile memory device using silver as the active material free from a silver etch step to improve desirable material characteristic and device reliability.

The terms "bottom" and "top" are for references only and not meant to be limiting.

Figure 1:
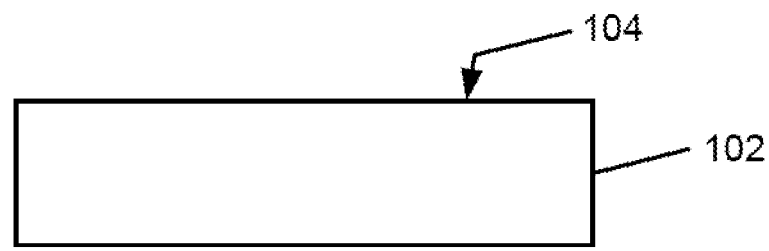
FIGS. 1-12 are simplified diagrams illustrating a method of fabricating a non-volatile memory device according to an embodiment of the present invention.

FIG. 1—area simplified diagrams illustrating a method for forming a resistive switching device for a non-volatile memory device according to an embodiment of the present invention. As shown in FIG. 1, a semiconductor substrate 102 having a surface region 104 is provided. The semiconductor substrate can be a single crystal silicon wafer, a silicon germanium material, a silicon-on-insulator (commonly called SOI) depending on the embodiment. In certain embodiments, the semiconductor substrate can have one or more CMOS devices formed thereon. The one or more CMOS devices can be controlling circuitry for the resistive switching device in a specific embodiment. The one or more CMOS devices can include one or more control transistors for the non-volatile memory device, for a separate processor, logic device, logic array, or the like, in some embodiments.

Figure 2:
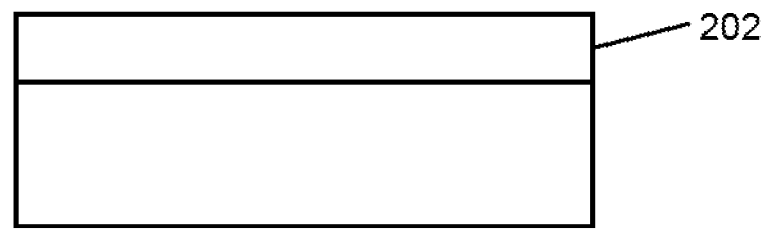
Figure 3:
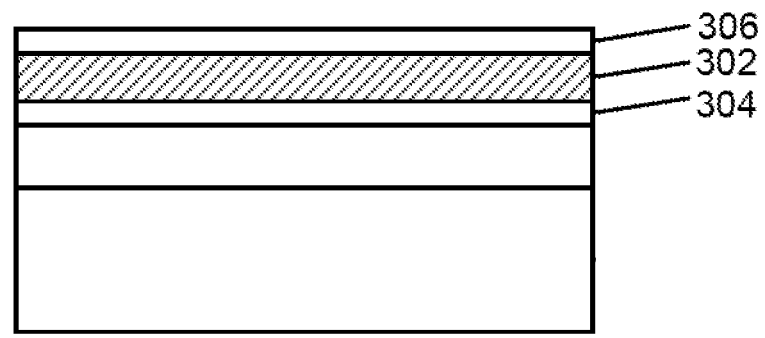

As illustrate in FIG. 2, the method includes depositing a first dielectric material 202 overlying the semiconductor substrate. The first dielectric material can be silicon oxide, silicon nitride, a dielectric stack of alternating layers of silicon oxide and silicon nitride (for example, an ONO stack), a low K dielectric, a high K dielectric, or a combination, and others, depending on the application. The first dielectric material can be deposited using techniques such as chemical vapor deposition, including low pressure chemical vapor deposition, plasma enhanced chemical vapor deposition, atomic layer deposition (ALD), physical vapor deposition, including any combination of these, and others Referring to FIG. 3, the method includes depositing a first wiring material overlying the first dielectric material. The first wiring material can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, a first adhesion material 304 is first formed overlying the first dielectric material before deposition of the first wiring material to promote adhesion of the first wiring material to the first dielectric material. A diffusion barrier material 306 may also be formed overlying the metal material to prevent the metal material to contaminate other portions of the device in a specific embodiment.

Figure 4:
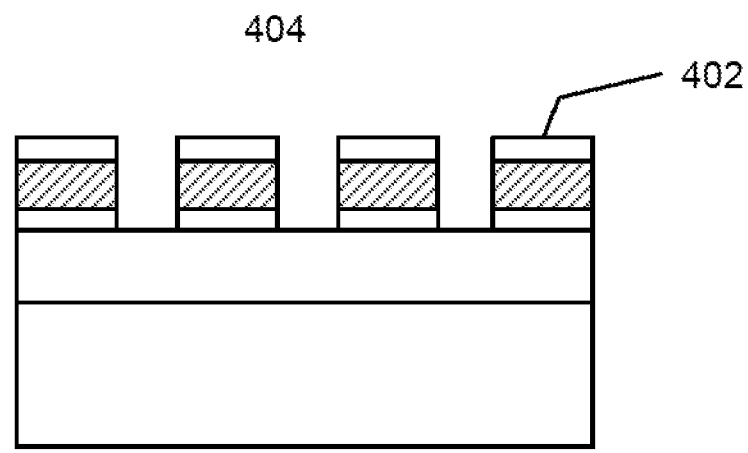
Figure 5:
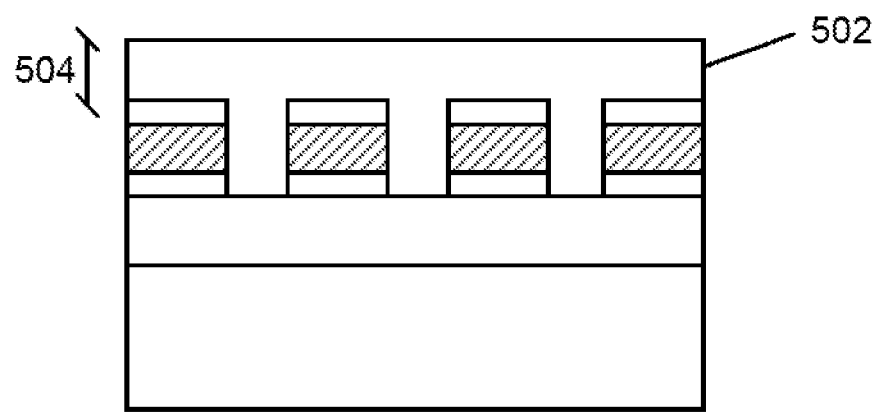

The method subjects the first wiring material to a first pattern and etching process to form a first wiring structure 402 in a specific embodiment. As shown in FIG. 4, the first wiring structure includes a plurality of elongated structures configured to extend in a first direction 404 in a specific embodiment. In a specific embodiment, the method deposits a second dielectric material 502 overlying the first wiring structure. The second dielectric material can be silicon oxide, silicon nitride, a dielectric stack of alternating layers of silicon oxide and silicon nitride (for example, an ONO stack), a low K dielectric, a high K dielectric, and others, depending on the application. The second dielectric material can be subjected to a planarizing process and to form a thickness 504 overlying the first wiring structure in a specific embodiment as shown in FIG. 5.

Figure 6:
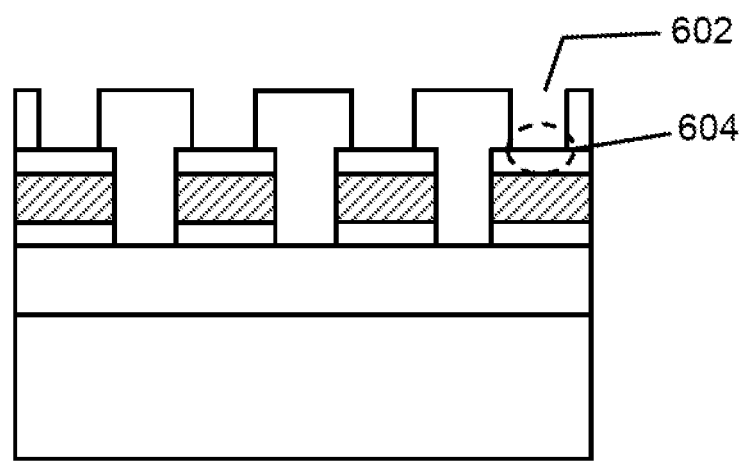
Figure 7:
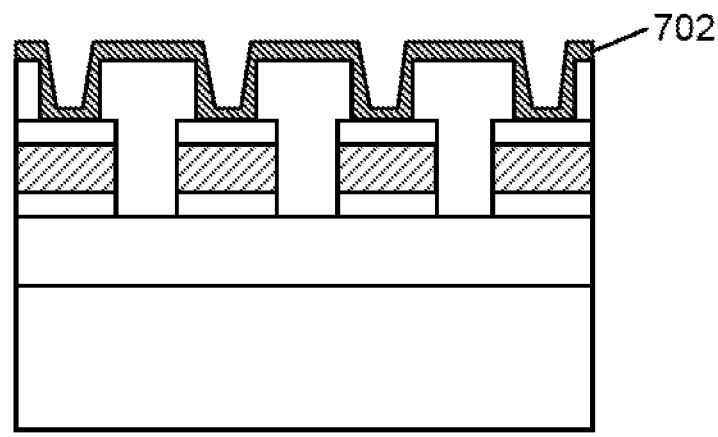

As shown in FIG. 6, the method includes subjecting the second dielectric material to a second pattern and etching process to form one or more via openings 602 to expose a top surface region 604 of the first wiring structure or the diffusion barrier material, if use. In a specific embodiment, a resistive switching material 702 is deposited to fill a first portion of each via opening and overlying the second dielectric material in FIG. 7. The resistive switching material can be a silicon material in a specific embodiment. The silicon material can include amorphous silicon material, silicon germanium material, polycrystalline silicon, microcrystalline silicon, and others. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

Figure 8:
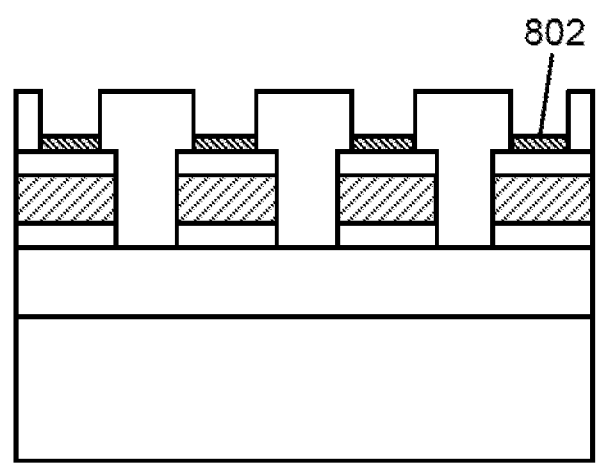

In a specific embodiment, the resistive switching material is subjected to an etch back process to selectively remove the resistive switching material to maintain exposure of a second portion of the via and a substantially horizontal portion surrounding the via opening in a surface region of the second dielectric material while the resistive switching material is substantially maintained in the first portion of the via opening 802 as shown in FIG. 8. The etch back process can be a chemical mechanical polishing process or a reactive ion etching process in a plasma environment. The etch back process can also be a wet etch process depending on the application.

Figure 9:
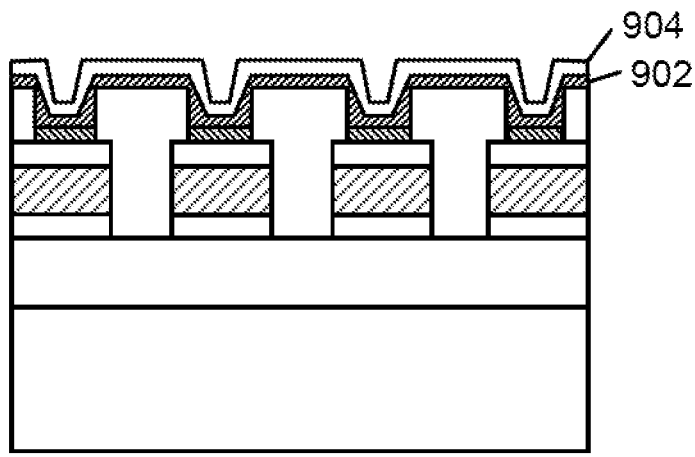

Referring to FIG. 9, the present method deposits an active material 902 overlying the resistive switching material in the second portion of the via opening and overlying the exposed horizontal surface region of the second dielectric material. For an amorphous silicon material as the resistive switching material, the active material can be a metal material such as silver, gold, platinum, palladium, nickel, or aluminum and others. The active material is preferably characterized by a suitable diffusivity in the resistive switching material under an applied electric field in a specific embodiment. In one embodiment, the metal material can be a silver material for amorphous silicon material as the resistive switching material. The silver material can be deposited using a physical vapor deposition process in a specific embodiment. Alternatively, the silver may be deposited using a chemical vapor deposition process, an electrochemical process including electroplating and electroless deposition, and any combinations of these, and others. The metal material is in physical and electric contact with the resistive switching material in a specific embodiment.

In some embodiments, the silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (potentially not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

In a specific embodiment, the method forms an adhesion material 904 overlying the active metal material (for example, silver material). The adhesion material can be titanium, titanium nitride, tantalum nitride, titanium tungsten, and any combinations of these, and others. The adhesion material may be formed using a physical vapor deposition process, a chemical vapor deposition process, atomic layer deposition process, or a combination, and others.

Figure 10:
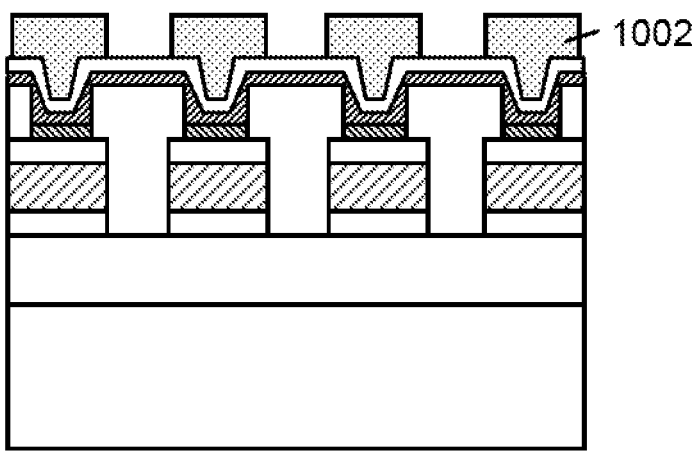

As shown in FIG. 10, a masking layer 1002 is formed overlying a first portion of the metal material and the adhesion material while exposing a second portion of the metal material and the adhesion material. The first portion of the metal material and the adhesion material overlies the via opening and the second portion of the metal material and the adhesion material overlies the second dielectric material in a specific embodiment. In a specific embodiment, the method selectively removes the second portion of the adhesion material and the metal material from the surface region of the second dielectric material using an etching process. In other embodiments, the masking layer 1002 need not be performed, and a mask-less lift-off process is performed, as described below.

Figure 11:
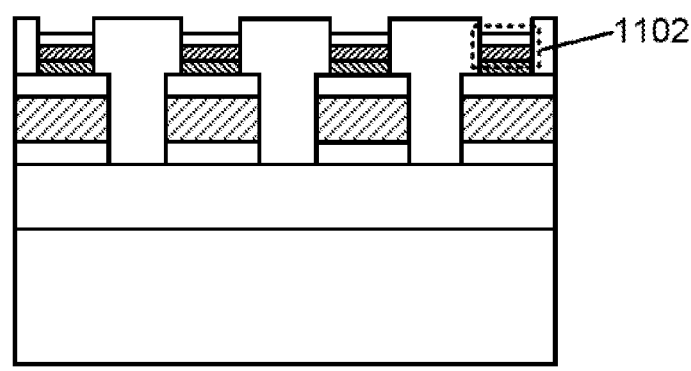

In various embodiments, the lift-off etching process can be performed with a wet etch process. The wet etch process includes using a solution comprising at least phosphoric acid, acetic acid, and nitric acid in a specific embodiment. In certain embodiment, the solution can be diluted using water, for example, de-ionized water. In a specific embodiment, the solution can have about 80% phosphoric acid, about 5% nitric acid, about 5% acetic acid, and about 10% de-ionized water. The wet etch process is further characterized by a removal rate or reaction rate. The reaction rate may be controlled by a proportion of acetic acid in the solution. An increase of acetic acid in the solution would slow the reaction rate in a specific embodiment. Depending on the embodiment, the wet etch process may be performed at room temperature or the solution may be heated, though the reaction may give out certain amount of heat. Reaction temperature can range from about room temperature (for example, about 25 Degree Celsius) to about 80 Degree Celsius or more preferably ranges from about 25 Degree Celsius to about 50 Degree Celsius. The solution is configured to weaken an adhesion between the metal material and the second dielectric material while maintaining the metal material to be in contact with the resistive switching material in the via opening in a specific embodiment. Etching by weakening the adhesion between two films is known as a lift-off process. As shown in FIG. 11, the metal material together with the adhesion material delaminates from the second dielectric material surface while maintaining the metal material and a portion of the adhesion material 1102 in the via opening.

Figure 12:
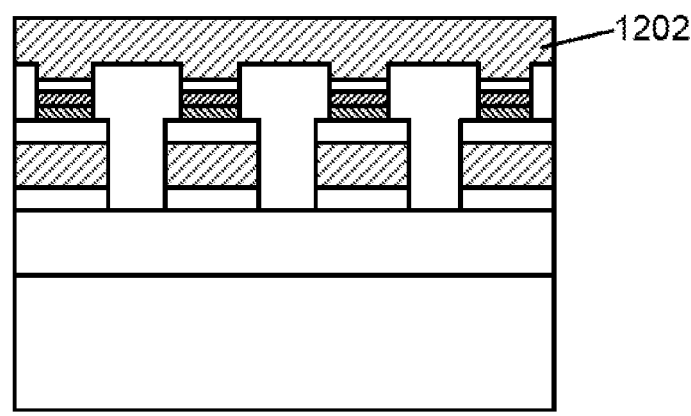

Referring to FIG. 12, the method includes depositing a second wiring material overlying the second dielectric material, which is exposed and the adhesion material in the via opening. The second wiring material can be copper, aluminum, tungsten, and others. The second wiring material can be deposited using techniques such as physical vapor deposition, chemical vapor deposition, electroplating or electroless deposition, and others, depending on the application. In certain embodiment, an adhesion material is formed over at least the second dielectric material surface before deposition of the second wiring material. The second wiring material, including the adhesion material, is subjected to a pattern and etch process to form a second wiring structure 1202 in a specific embodiment. The second wiring structure includes one or more elongated structures configured to extend in a second direction orthogonal to the first direction in a specific embodiment.

Depending upon the embodiments, there can be other variations. For example, a contact material can be formed interposed between the first wiring material and the amorphous silicon material. The contact material can be a p+ polysilicon material or other silicon-based material having a suitable conductivity characteristic. The contact material controls a defect density in an interface region between the first wiring material and the amorphous silicon and allows for a desirable switching behavior in a specific embodiment. In other embodiments, the contact material may not be necessary.

Figure 13:
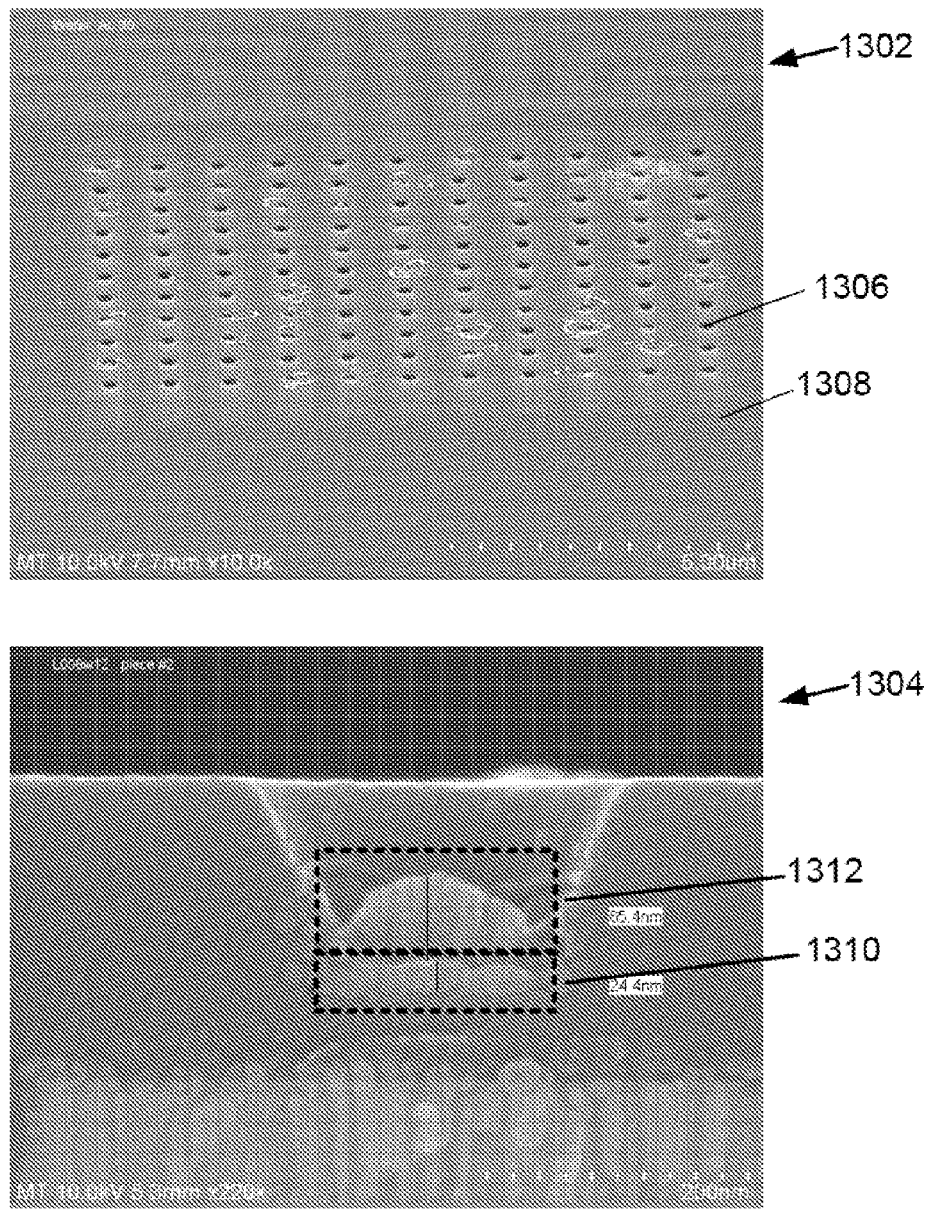
FIG. 13 illustrates images of scanning electron microscope of a partially fabricated device according to an embodiment of the present invention.

Embodiments according to the present invention provide a method for forming an active metal material for resistive switching for a resistive switching device. The method selectively removes the active material from a surface region of a dielectric material to maintain the active material in a via structure for the resistive switching device in a specific embodiment. To illustrate the present invention, experiments have been performed. FIG. 13 illustrates scanning electron microscope images after removal of a silver material from a silicon oxide surface by a lift off process, as in FIG. 11, according to an embodiment of the present invention. As shown in a top view image 1302, via openings 1306 are clean and silicon oxide surface 1308 is substantially free from silver material. A cross sectional view 1304 of the via structure is also shown. Silver material 1310 is maintained in the via openings and is in contact with the amorphous switching material. A portion of the titanium/titanium nitride adhesion material forms a cap structure 1312 overlying the silver material, as shown.

In various embodiments, as the memory devices describe herein are small compared to standard memories, a processor, or the like, may include greater amounts of memory (cache) on the same semiconductor device. As such memories are relatively non-volatile, the states of such processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile the processor need not draw power to refresh the memory states, as is common with CMOS type memories. Accordingly, embodiments of the present invention are directed towards processors or other logic incorporating memory devices, as described herein, devices (e.g. smart phones, network devices) incorporating processors or other logic incorporating such memory devices, and the like.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for forming a non-volatile memory device configured with a resistive switching element, the method comprising:
   providing a substrate having a surface region;
   depositing a first dielectric material overlying the surface region;
   forming a first wiring structure overlying the first dielectric material;
   depositing a second dielectric material overlying the first wiring structure;
   forming a via opening in the second dielectric material to expose a portion of the first wiring structure, while maintaining a portion of the second dielectric material;
   forming a resistive switching material structure comprising an amorphous silicon material within the via opening;
   depositing a metal material comprising a silver material, wherein a first portion of the metal material overlies the resistive switching material structure, and wherein a second portion of the metal material overlies at least the portion of the dielectric material, wherein the first portion of the metal material contacts the resistive switching material structure;
   forming a diffusion barrier layer overlying the metal material, wherein a first portion of the diffusion barrier layer contacts the first portion of the metal material; and
   selectively removing the second portion of the metal material and a second portion of the diffusion barrier layer overlying the second portion of the metal material to form a second wiring structure using a solution at a predetermined temperature while maintaining the portion of the diffusion barrier material and the first portion of the metal material within the via opening, wherein the solution is selected from a group consisting of: phosphoric acid, acetic acid, nitric acid, water, and combinations thereof.

2. The method of claim 1, wherein the solution weakens adhesion between the second portion of the metal material and the portion of the dielectric material to delaminate the second portion of the metal material from the portion of the dielectric material.

3. The method of claim 1 wherein the resistive switching material structure comprises undoped amorphous silicon, and wherein the first wiring structure comprises p-doped polysilicon.

4. The method of claim 1 wherein the first wiring structure is selected from a group consisting of: tungsten, aluminum, copper, silver, a doped semiconductor material.

5. The method of claim 3
wherein the first wiring structure is spatially configured to extend in a first direction; and
wherein the second wiring structure is spatially configured to extend in a second direction orthogonal to the first direction.

6. The method of claim 1 wherein a metal material for the first wiring structure is selected from a group consisting of: tungsten, copper, silver, aluminum, an alloy.

7. The method of claim 1 wherein the diffusion barrier material is selected from a group consisting of: titanium, titanium nitride, tantalum nitride, titanium tungsten, or a combination thereof.

8. The method of claim 1 wherein the metal material is characterized by a diffusivity in the resistive switching material structure in the presence of an electric field.

9. The method of claim 1 wherein the predetermined temperature ranges from about 25 Degree Celsius to about 80 Degree Celsius.

10. The method of claim 1 wherein the resistive switching material structure is selected from a group consisting of: a single resistive switching material layer; a barrier layer between a first resistive switching material layer and a second resistive switching material layer; an oxide layer between a first undoped amorphous silicon layer and a second undoped amorphous silicon layer.

11. The method of claim 1 wherein the solution comprises about 80% phosphoric acid, about 5% acetic acid, about 5% nitric acid, and about 10% water.

12. The method of claim 1 wherein selectively removing the second portion of the metal material and the second portion of the diffusion barrier material is characterized by a reaction rate, wherein the reaction rate decreases with an increase of acetic acid in the solution.

13. The method of claim 1
wherein the first wiring structure comprises one or more adhesion materials or diffusion barrier materials;
wherein the one or more adhesion materials or diffusion barrier materials are selected from a group consisting of: titanium, titanium nitride, tantalum nitride, titanium tungsten, and combinations thereof.

14. The method of claim 1 wherein the first wiring structure includes a material selected from a group consisting of: polysilicon material, silicon germanium material, a microcrystalline silicon material.

15. A method for forming a silver active metal for a non-volatile memory device, comprising:
forming a first wiring structure overlying a surface region of a substrate;
depositing a first dielectric material overlying the first wiring structure;
forming a via opening in the first dielectric material to expose a portion of the first wiring structure, while maintaining a portion of the first dielectric material;
forming a structure of resistive switching material within the via opening, wherein the resistive switching material comprises a silicon material;
forming a silver material overlying the structure of resistive switching material and overlying the portion of the first dielectric material;
forming a diffusion barrier layer overlying the silver material to form a resulting structure;
selectively removing a portion of the silver material and a portion of the diffusion barrier layer overlying the portion of the first dielectric material while maintaining a portion of the silver material and a portion of the diffusion barrier material overlying the layer of silicon material within the via opening via a wet etch process using a solution comprising: acetic acid, phosphoric acid, and nitric acid.

16. The method of claim 15 wherein forming the structure of resistive switching material comprises: forming a first undoped amorphous silicon layer, forming a barrier layer on top of the first undoped amorphous silicon layer, and forming a second undoped amorphous silicon layer on top of the barrier layer.

17. The method of claim 15 wherein the wet etch process is carried out at a temperature ranging from about 35 Degree Celsius to about 45 Degree Celsius.

18. The method of claim 15 wherein the solution comprises about 80% phosphoric acid, about 5% acetic acid, about 5% nitric acid, and about 10% water.

19. The method of claim 15 wherein the wet etch process is patternless.

20. A method for forming a silver active metal for a non-volatile memory device, comprising:
forming a first wiring structure overlying a surface region of a substrate;
depositing a first dielectric material overlying the first wiring structure;
forming a via opening in the first dielectric material to expose a portion of the first wiring structure, while maintaining a portion of the first dielectric material;
forming a structure of resistive switching material within the via opening, comprising:
forming a first undoped amorphous silicon layer;
forming a barrier layer on top of the first undoped amorphous silicon layer; and
forming a second undoped amorphous silicon layer on top of the barrier layer;
wherein the resistive switching material comprises a silicon material;
forming a silver material overlying the structure of resistive switching material and overlying the portion of the first dielectric material;
forming a diffusion barrier layer overlying the silver material to form a resulting structure;
selectively removing a portion of the silver material and a portion of the diffusion barrier layer overlying the portion of the first dielectric material while maintaining a portion of the silver material and a portion of the diffusion barrier material overlying the layer of silicon material within the via opening.

21. The method of claim 20 wherein selective removing the portion of the silver material and the portion of the diffusion barrier layer overlying the portion of the first dielectric material comprises subjecting a resulting structure to a wet etch process using a solution selected from a group consisting of: phosphoric acid, acetic acid, nitric acid, water, and combinations thereof.

* * * * *